United States Patent [19]

Yamazaki et al.

[11] Patent Number: 4,680,855
[45] Date of Patent: Jul. 21, 1987

[54] ELECTRONIC DEVICE MANUFACTURING METHODS

[75] Inventors: Shunpei Yamazaki; Kenji Itoh; Susumu Nagayama, all of Tokyo, Japan

[73] Assignee: Semiconductor Energy Laboratory Co., Ltd., Japan

[21] Appl. No.: 791,733

[22] Filed: Oct. 28, 1985

[30] Foreign Application Priority Data

Oct. 29, 1984 [JP] Japan ................. 59-227498
Oct. 29, 1984 [JP] Japan ................. 59-227499

[51] Int. Cl.⁴ .................. H01L 21/302; H01L 21/461
[52] U.S. Cl. ........................ 29/583; 29/572; 29/582; 29/591; 156/643; 219/121 LJ; 219/121 LN

[58] Field of Search ................. 29/572, 582, 583, 591; 156/643; 219/121 LJ, 121 LN; 136/244, 258 AM

[56] References Cited

U.S. PATENT DOCUMENTS 4,528,065  7/1985  Yamazaki .................... 156/643

*Primary Examiner*—Aaron Weisstuch
*Attorney, Agent, or Firm*—Gerald J. Ferguson, Jr.; Michael P. Hoffman; Ronni S. Malamud

[57] ABSTRACT

An electronic device manufacturing method including a step of forming a layer member to be patterned, which is a conductive metal layer member, a laminate member of a transparent conductive layer and a non-transparent or reflective layer or a non-single-crystal semiconductor layer member, and a step of scanning the layer member by a spot-shaped laser beam or exposing the layer member to radiation by one or more linear pulsed laser beams, thereby forming the patterned layer.

18 Claims, 18 Drawing Figures

ELECTRONIC DEVICE MANUFACTURING METHODS

BACKGROUND OF THE INVENTION

1. Field of the Invention

The present invention relates to a method for the manufacture of an electronic device which has at least a patterned layer chosen from a patterned conductive metal layer, a patterned laminate member comprising a transparent conductive layer and a nontransparent or reflective conductive layer, and a patterned non-single-crystal semiconductor layer, such as a semiconductor photoelectric conversion device, field effect transistor, liquid crystal display or the like, and more particularly to improvements in an electronic device manufacturing method which includes at least a step of forming a layer member to be patterned, which is chosen from a conductive metal layer member, a laminate member comprising a transparent conductive layer and a nontransparent or reflective layer, and a non-single-crystal semiconductor layer member, and a step of patterning the layer member by means of one or more laser beams.

2. Description of the Prior Art

Heretofore there has been proposed an electronic device manufacturing method which includes at least a step of forming a layer member to be patterned, which layer member is chosen from a conductive metal layer member, a laminate member comprising a transparent conductive layer and a nontransparent or reflective layer, and a non-single-crystal semiconductor layer member, and a step of patterning the layer member by means of a laser beam to form a patterned layer including a patterned conductive metal layer, a patterned laminate member comprising a transparent conductive layer and a nontransparent or reflective conductive layer, or a patterned non-single-crystal semiconductor layer. Compared with another manufacturing method which employs a photolithography technique for the formation of such a patterned layer, the abovesaid method excels in that the patterned layer can be formed without any defects. The reason for this is that in the case of forming the patterned layer by photolithography, a photoresist mask used therein is prone to pinholing or exfoliation at its marginal edges, which results in the formation of defects, whereas the method utilizing the laser beam patterning process has no such factors which cause defects.

With the conventional method employing the laser beam technique for the formation of the patterned layer, it is a general practice to use a YAG laser which emits a laser beam having a relatively long wavelength of about 1060 nm.

The absorption coefficient of the layer member for a laser beam of such relatively long wavelength is extremely small. For example, when the layer member to be patterned is a conductive metal layer member constituted principally of a sublimable metal such as Cr, Cr-Cu alloy, Cr-Ag alloy or Cr-N alloy, or a nonsublimable metal such as Al, Cu, Ag, Ni, Mg or stainless steal, or when the laminate member comprises a transparent conductive layer constituted principally of a sublimable metallic oxide such as $SnO_2$, $In_2O_3$ or ITO (Indium-Tin oxide), a sublimable metallic nonoxide such as Si-Cr or Si-Ni alloy, or a sublimable metallic nitride such as SbN, InN or $Sn_5N_4$, and the nontransparent or reflective conductive layer member is constituted principally of the abovesaid sublimable metal or the nonsublimable metal referred to above as the conductive metal layer member, or when the non-single-crystal semiconductor layer member consists principally of a sublimable semiconductor material such as Si, $Si_xGe_{1-2}$ $(0<x<0.5)$, $Si_xC_{1-x}$ $(0<X<1)$, $Si_3N_{4-x}$ $(0<x<2)$ or $SiO_{2-x}$ $(0<x<1)$, the absorption coefficient of the layer member to be patterned is $10^2$/cm or less. The reason for this is as follows: In the case where the laser beam has a wavelength as long as 1060 nm, its optical energy is much smaller than the optical band gap energy of the layer member to be patterned. For instance, in the case of the laser beam having a wavelength of 1060 nm, its optical energy is about 1.23 eV. On the other hand, when the layer member is the abovesaid conductive metal layer member, the laminate member comprising transparent and nontransparent conductive layers, or a non-single-crystal semiconductor layer member, its optical band gap energy is in the range of 3 to 4 eV.

For patterning of the layer member by a laser beam having such a relatively long wavelength of 1060 nm or so, it is necesssary that the laser beam be high-powered, since the absorption coefficient for the laser beam of the layer member to be patterned is extremely small. And therefore, when the layer member to be patterned is as thin as 2 μm or less, it is feared that the substrate and other layers underlying may be damaged or patterned. Also it is feared that the marginal edges of the patterned layer will become swollen or exfoliated.

Furthermore, in the case of the laser beam having such a relatively long wavelength of 1060 nm or so, it is difficult to reduce its minimum spot diameter to a small value of 100 μm or less. Therefore, it is difficult, with the conventional manufacturing method, to finely form the patterned layer with high precision. In addition, in the case of simultaneously forming a plurality of patterned layers, they cannot be spaced apart a small distance of 100 μm or less. This imposes severe limitations on the fabrication of a small and compact electronic device having the patterned layer.

SUMMARY OF THE INVENTION

It is therefore an object of the present invention to provide a novel method for the manufacture of an electronic device having at least a patterned layer chosen from a patterned conductive metal layer, a patterned laminate member comprising a transparent conductive layer and a nontransparent or reflective conductive layer, and a patterned non-single-crystal semiconductor layer, which is free from the abovesaid defects of the prior art.

The electronic device manufacturing method of the present invention includes at least a step of forming a layer member to be patterned, which layer member is chosen from a conductive metal layer member, a laminate member comprising a transparent conductive layer and a nontransparent or reflective layer, and a non-single-crystal semiconductor layer member, and a step of scanning the layer member by a spot-shaped laser beam or exposing the layer member to irradiation by one or more linear laser beams, thereby forming the patterned layer. In this case, the laser beam has a wavelength of 400 nm or less, which is smaller than in the past and has an optical energy greater than the optical band gap energy of the layer member to be patterned.

With the use of a laser beam having such a short wavelength equal to or less than 400 nm, the absorption coefficient for the laser beam of the layer member to be patterned is far larger than the absorption coefficient for the laser beam having the long wavelength of about 1060 nm. For example, the absorption coefficient of the layer member to be patterned is $10^4$/cm or more, which is more than 100 times larger than the absorption coefficient (approximately $10^2$/cm) for the laser beam of 1060 nm or so wavelength used in the past. Therefore, the laser beam need not be high-powered. Further, even if the layer member to be patterned is as thin as 2 μm or less, there is no possibility of damaging or patterning the underlying substrate or layer by the laser beam. Further, the method of the present invention is free from the fear of swelling or exfoliating the marginal edges of the patterned layer as a result of the patterning thereof.

Moreover, the laser beam of 400 nm or less wavelength can be easily reduced to a minimum spot diameter or width as small as 100 μm or less on the layer member to be patterned. This permits the formation of the patterned layer with higher precision and more finely than in the past. Moreover, in the case of forming a plurality of such patterned layers, they can be spaced apart at a small distance such as 100 μm or less. Accordingly, the manufacturing method of the present invention provides a smaller and more compact electronic device having a plurality of patterned layers than does the conventional method.

In accordance with another aspect of the present invention, a linear laser beam or beams, which are obtained by diverging a laser beam from a laser beam source and then applying the diverged laser beam to a cylindrical lens or lenses, are used for irradiating the layer member to be patterned. By preselecting the length of such a linear laser beam or beams greater than the width of the layer member to be patterned and by moving the beam or beams continuously or intermittently in a predetermined direction, a square, rectangular, or strip-like patterned layer or layers can easily be obtained from the layer member in a short time.

Other objects, features and advantages of the present invention will become more fully apparent from the following detailed description taken in conjunction with the accompanying drawings.

DESCRIPTION OF THE PREFERRED EMBODIMENTS

Figure 1:
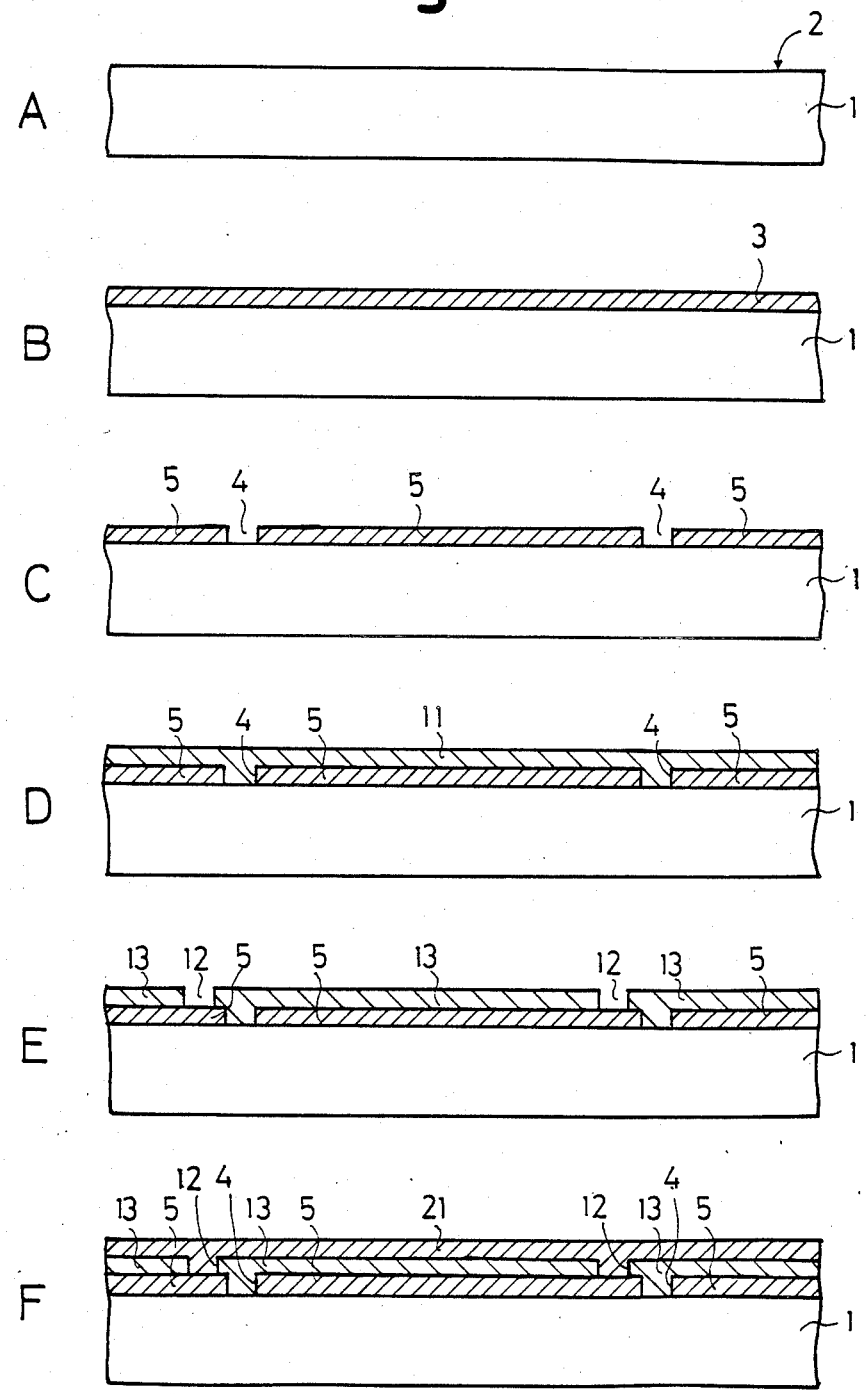
FIGS. 1A to 1H are schematic sectional views illustrating, by way of example, a sequence of steps involved in the manufacture of a semiconductor photoelectric conversion device having a plurality of semiconductor photoelectric conversion transducers according to the present invention.
Figure 1:
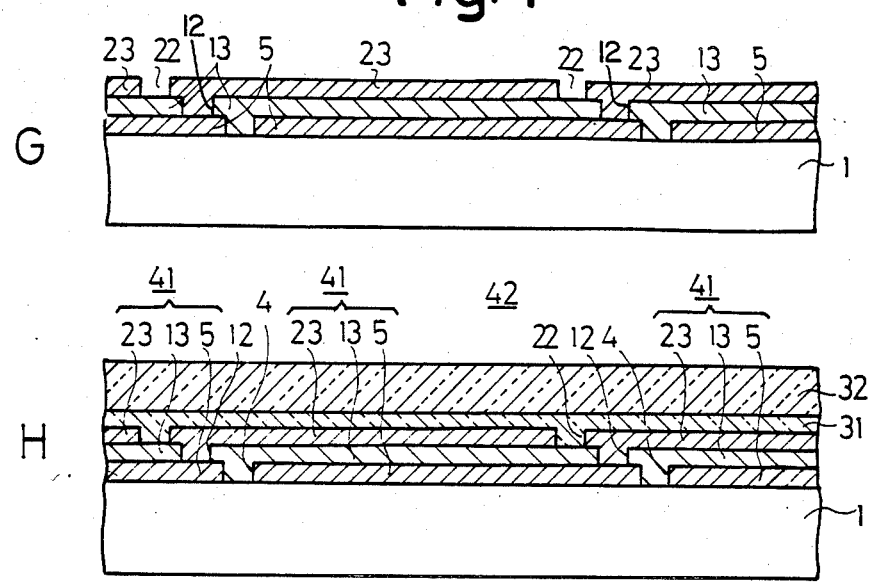

Referring first to FIG. 1, the manufacture of a semiconductor photoelectric conversion device illustrative of an electronic device according to the present invention starts with the preparation of a substrate 1 (FIG. 1A).

The substrate 1 has a surface 2 of an organic or inorganic insulator. As such a substrate 1, for example, a synthetic resin substrate can be used which is transparent or nontransparent. It is also possible to employ a ceramic substrate, a transparent glass substrate, and a substrate which has an insulating film of synthetic resin, a silicon oxide, or the like, deposited on a stainless steel or metal plate.

A conductive layer member 3 to be patterned is formed on the substrate 1, by means of a known evaporation method or CVD method (FIG. 1B). The conductive layer member 3 has a thickness of 2 μm or less.

The conductive layer member 3 may be formed as a nontransparent conductive metal layer member. In such a case, the substrate 1 need not be transparent. The conductive metal layer member is constituted principally of a sublimable metal such as Cr, a Cr-Cu alloy (containing 0.1 to 50 Wt% of Cu), a Cr-Ag alloy (containing 0.1 to 50 wt% of Ag), a Cr-N alloy (containing 0.1 to 50 wt% of N), or a nonsublimable metal such as Al, Cu, Ag, Ni, Mg, or stainless steal.

The conductive layer member 3 may also be a laminate member which comprises a transparent conductive layer member constituted principally of a sublimable metallic oxide such as $SnO_2$, $In_2O_3$, or ITO (Indium-Tin oxide), a sublimable metallic nonoxide such as a Si-Cr or Si-Ni alloy, or a sublimable metallic nitride such as a SbN, InN, or $Sn_5N_4$, and a nontransparent or reflective conductive layer constituted principally of the abovesaid sublimable metal or the nonsublimable metal referred to above as the conductive metal layer member. In this case, the nontransparent conductive layer is formed on the side of the substrate 1, and the substrate 1 need not be transparent.

The conductive layer member 3 may also be formed as a transparent conductive layer member. In this case, the substrate 1 is transparent. The transparent conductive layer member is constituted principally of the abovesaid sublimable metallic oxide, the sublimable metallic nonoxide material, or the sublimable metallic nitride referred to above as the transparent conductive layer member of the laminate member.

Next, the conductive layer member 3 is subjected to patterning by the use of one or more laser beams, forming a plurality of patterned conductive layers 5 which are each isolated from adjacent ones by a groove 4 (FIG. 1C).

The laer beam or beams used are spot-shaped or linear laser beams which have a wavelength of 400 nm or less and optical energy (3.1 eV or more) greater than the optical band gap energy of the conductive layer member 3 to be patterned.

Where the spot-shaped laser beam or beams are used, they have a 3 to 60 μm spot diameter in cross section on the conductive layer member 3. The spot-shaped laser beam or beams may be pulsed laser beams that have a duration of 50 nano-seconds or less and frequency of 1 to 100 Hz.

As the spot-shaped pulsed laser beam or beams, it is possible to employ a pulsed laser beam or beams of wavelength 193 nm or so (ArF), 248 nm or so (KrF), 308 nm or so (XeCl), or 315 nm or so (XeF) obtainable with an excimer laser, 363 nm or so or 351 nm or so obtainable with an argon laser, or 337 nm or so, obtainable with a nitrogen laser.

When the linear pulsed laser beams are used, they can be created in such a manner as described below in conjunction with FIG. 5.

A square- or rectangular-sectioned pulsed laser beam 52 of small cross-sectional area such as 16×20 mm, which is available, for example, from an aforesaid excimer, argon, or nitrogen laser beam source 51 is applied to a beam magnifier 53 to obtain a pulse laser beam 54 which is similar in cross section profile to the laser beam 52 but has a larger cross-sectional area than the latter. In order words, a diverged pulsed laser beam 54 is obtained from the laser beam 52. Next, the pulsed laser beam 54 is applied via a reflector 55 to a cylindrical lens array 57 which has a plurality of cylindrical lenses 56 arranged in a common plane, by which are obtained a plurality of linear pulsed laser beams 57, for example, 30 cm long and 15 μm wide, which are converged on the conductive layer member 3.

When the abovesaid spot-shaped or linear pulsed laser beam or beams having a wave length 400 nm or less are used, since the spot-shaped or linear laser beam or beams have a short wavelength of 400 nm or less, the absorption coefficient of the conductive layer member 3 for the laser beam is more than 100 times larger than the absorption coefficient for a laser beam having a long wavelength of about 1060 nm which is obtainable with a YAG laser. Accordingly, the conductive layer member 3 is effectively heated by the laser beam locally at the positions of its irradiation. On the other hand, since the conductive layer member 3 is as thin as 2 μm or less, it does not transfer therethrough heat resulting from the irradiation by the laser beam, namely, the heat generated in the conductive layer member 3 does not escape therefrom to the outside through the conductive layer member 3 itself. Moreover, the substrate 1 has an insulating surface, and hence it also prevents the heat generated in the conductive layer member 3 from escaping therefrom to the outside through the substrate 1. Accordingly, even if the conductive layer member 3 is or has a conductive metal layer constituted principally of nonsublimable metal, the material of the conductive layer member 3 is effectively sublimed at the position of irradiation by the laser beam. In this case, it is preferable that the scanning or irradiation of the conductive layer member 3 by the abovesaid spot-shaped or linear pulsed laser beam or beams having a 400 nm or less wavelength be carried out under a reduced pressure of $10^{-5}$ torr or less. This ensures more effective sublimation of the material forming the conductive layer member 3.

Figure 2:
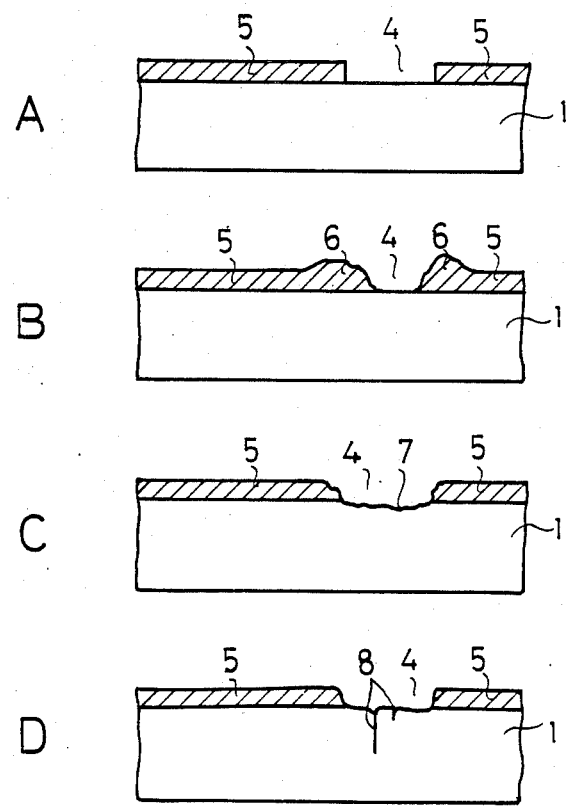
FIGS. 2A to 2D are schematic sectional views explanatory of a patterned conductive layer which is formed on a substrate during the fabrication of the semiconductor photoelectric conversion device.

As a result of this, patterned conductive layers 5 are neatly formed, along with the grooves 4, as shown in FIG. 2A. In this case, there is no possibility that the material of the patterned conductive layers 5, molten by the laser beam irradiation, is deposited on the marginal edges of the patterned conductive layers 5, as indicated by 6, in FIG. 2B. Further, since the laser beam is effectively absorbed by the conductive layer member 3 because of its short wavelength, it does not inflict on the substrate 1 unnecessary damage such as depressions and cracks as indicated by 7 and 8, respectively, in FIGS. 2C and 2D, respectively.

Figure 5:
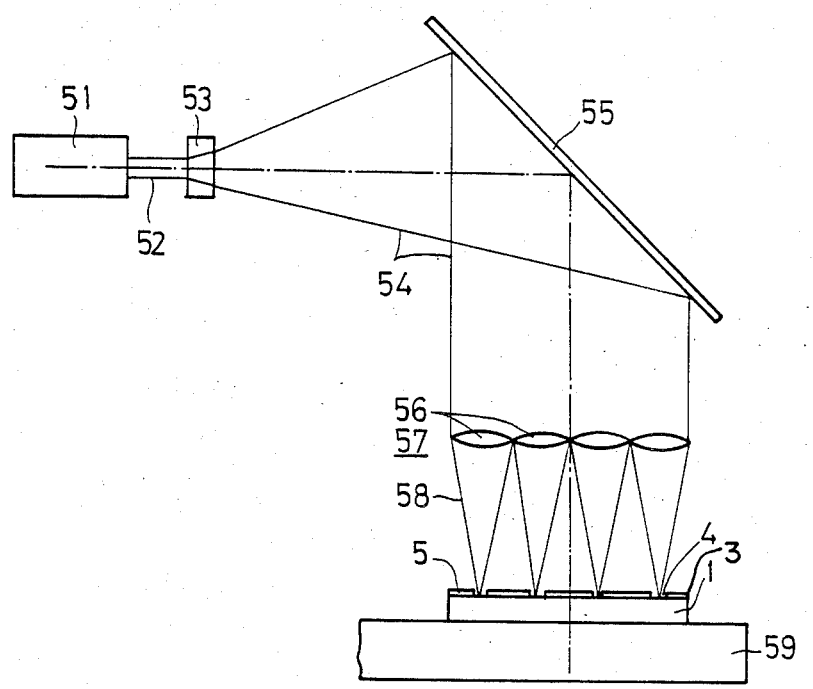
FIG. 5 is a schematic diagram showing how a layer member is patterned into a plurality of patterned layers by means of a plurality of linear laser beams.

FIG. 5 shows the case in which the conductive layer member 3 formed on the substrate 1, which is mounted on a table 59, is patterned by four linear laser beams into five patterned conductive layers 5. In this case, a number of such patterned conductive layers 5 can also be easily obtained by moving the table 59 while scanning or irradiating the conductive layer member 3 by the spot-shaped or linear laser beam or beams. In the case of FIG. 5, the table 59 need not be moved since five patterned conductive layers 5 are formed by using four laser beams as mentioned above.

Next, a non-single-crystal semiconductor layer member 11 is formed, by a known CVD, low-pressure CVD, plasma or glow discharge CVD, or photo CVD method, on the substrate 1 so that it covers the patterned conductive layers 5 and extends into the grooves 4 (FIG. 1D).

The non-single-crystal semiconductor layer member 11 has a thicknesss, for instance, of 2 μm or less.

The non-single-crystal semiconductor layer member 11 has a PN junction structure wherein a P-type non-single-crystal semiconductor layer and an N-type non-single-crystal semiconductor layer are laminated one on the other in this order or in the reverse order, or a PIN junction structure wherein P-, I-, and N-type non-single-crystal semiconductor layers are laminated one on another in this order or in the reverse order.

The non-single-crystal semiconductor layer member 11 may be constituted mainly of a sublimable semiconductor material such as Si, $Si_xGe_{1-4}$ (where $0<x<0.5$), $Si_xC_{1-x}$ (where $0<x<1$), $Si_3N_{n-x}$ (where $0<x<2$), or $SiO_{2-x}$ (where $0<x<1$), and the layer 11 has introduced therein hydrogen or a halogen as a dangling bond neutralizer.

Next, the non-single-crystal semiconductor layer member 11 is subjected to patterning by one or more laser beams, thereby forming a plurality of patterned non-single-crystal semiconductor layers 13 each isolated from adjacent ones by a groove 12 (FIG. 1E).

In this case, the grooves 12 are each formed to expose each conductive layer 5 in the vicinity of each groove 4. Accordingly, each patterned non-single-crystal semiconductor layer 13 extends on one patterned conductive layer 5, into the groove 4, and slightly further onto the adjoining patterned conductive layer 5.

The patterning of the non-single-crystal semiconductor layer member 11 may be effected using the same spot-shaped or linear laser beam or beams having a wavelength of 400 nm or less as those for the formation of the patterned conductive layers 5. Therefore, no detailed description will be repeated.

Figure 3:
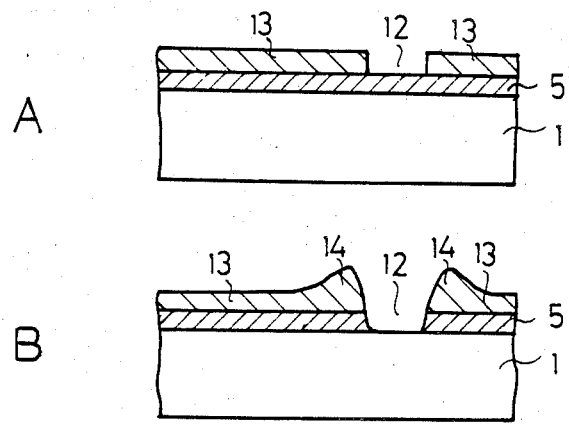
FIGS. 3A and 3B are schematic sectional views explanatory of a patterned non-single-crystal semiconductor layer which is formed on the patterned conductive layer during the fabrication of the semiconductor photoelectric conversion device.

In the case where the spot-shaped or linear laser beam or beams having a wavelength 400 nm or less are used, the absorption coefficient of the non-single-crystal semiconductor layer member 11 for the laser beam or beams is also large as is the case with the aforementioned conductive layer member 3, because the laser beam used has a short wavelength such as 400 nm or less. Therefore, the non-single-crystal semiconductor layer member 11 is effectively heated at the position of irradiation by the laser beam as in the case of the aforementioned conductive layer member 3. Further, since the non-single-crystal semiconductor layer member 11 is as thin as 2 μm or less, it does not transfer laterally therethrough the heat generated therein, thereby preventing the heat from escaping from the layer member 11 to the outside, as described previously. Moreover, in the case where the non-single-crystal semiconductor layer member 11 is constituted principally of the sublimable semiconductor, as referred to previously, the patterned non-single-crystal semiconductor layers 13 can be formed neatly, along with the grooves 12, as shown in FIG. 3A, and it is possible to prevent the material of each non-single-crystal semiconductor layer 13, molten by the laser beam irradiation, from being deposited on its marginal edge, as indicated by 14 in FIG. 3B, and the conductive layer 5 from being hollowed, by the laser beam, thereby avoiding the formation therein of a deep depression which may sometimes reach the substrate 1, also as indicated in FIG. 3B.

Next, a conductive layer member 21, which covers the patterned non-single-crystal semiconductor layers 13 and extends into the grooves 12, is formed on the substrate 1 by the same method as that for the formation of the patterned conductive layer 3 (FIG. 1F).

The conductive layer member 21 has a thickness of 2 μm or less.

The conductive layer member 21 may be formed as a transparent conductive layer member which is constituted principally of the sublimable metallic oxide, sublimable metallic nitride, or sublimable metallic nonoxide material mentioned previously with regard to the conductive layer 3. In this case, the substrate 1 and the patterned conductive layer need not be transparent. It is preferable, however, that the patterned conductive layer is a laminate member comprising the nontransparent or reflective conductive layer and the non-transparent conductive layer formed on the transparent conductive layer.

The conductive layer member 21 may also be formed as a nontransparent conductive metal layer member which is constituted principally of the aforesaid sublimable metal or the nonsublimable metal. In such a case, the substrate 1 and the patterned conductive layer 5 are transparent.

Moreover, the conductive layer member 21 may also be formed as a laminate member which composed of a transparent conductive layer constituted mainly of the aforesaid sublimable metallic oxide, the sublimable metallic nonoxide, or the sublimable metallic nitride and a nontransparent or reflective conductive layer which is constituted mainly of the aforementioned sublimable or nonsublimable metal. In this case, the transparent conductive layer is formed on the side of the non-single-crystal semiconductor layer 13, and the substrate 1 and the patterned conductive layer 5 are transparent.

Next, the conductive layer member 21 is subjected to patterning by one or more laser beams, forming a plurality of patterned conductive layers 23 which are each isolated from adjacent ones by a groove 22 (FIG. 1G).

In this case, the grooves 22 are each formed to expose one of the patterned non-single-crystal semiconductor layers 13 in the vicinity of one of the grooves 12. Accordingly, each patterned conductive layer 23 extends on one of the non-single-crystal semiconductor layers 13 and down into one of the grooves 12, wherein it is connected to the underlying conductive layer 5, and it further extends slightly onto the adjoining non-single-crystal semiconductor layer 13.

The laser beam used for the patterning of the conductive layer member 21 into the patterned conductive layers 23 may be the same spot-shaped or linear pulsed laser beam or beams having a wavelength of 400 nm or less such as those used for the formation of the patterned conductive layers 5. Therefore, no detailed description will be repeated.

Figure 4:
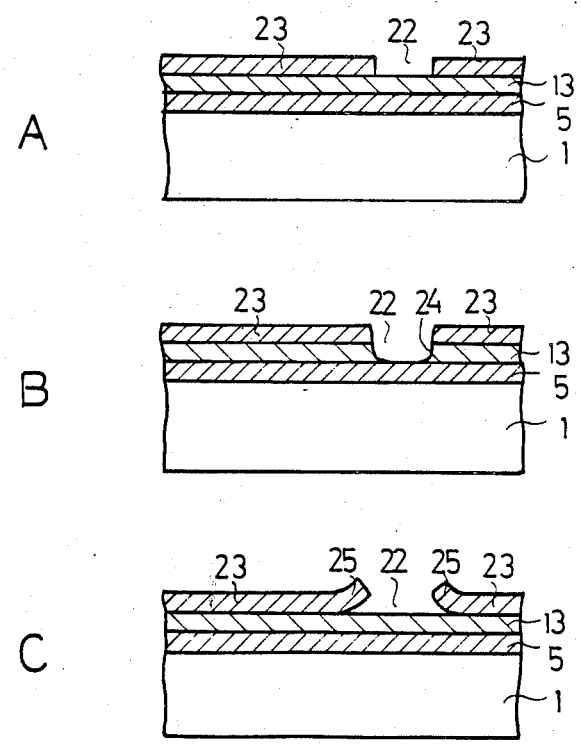
FIGS. 4A to 4C are schematic sectional views explanatory of a patterned conductive layer which is formed on the patterned non-single-crystal semiconductor layer during the fabrication of the semiconductor photoelectric conversion device.

Since the spot-shaped or linear laser beam or beams having 400 nm or less wavelength are used, the absorption coefficient of the conductive layer member 21 is large as described previously in connection with the formation of the patterned conductive layers 5. On the other hand, the conductive layer member 21 is thin, so that the patterned conductive layers 23 are neatly formed, along with the grooves 22. That is to say, there is no possibility that the underlying non-single-crystal semiconductor layers 13 are hollowed, by the laser beam, to form therein deep depressions which may sometimes reach the underlying conductive layers 5, as indicated by 24 in FIG. 4B, and that the patterned conductive layers 23 are exfoliated at their marginal edges, as indicated by 25 in FIG. 4C.

Next, a passivation film 31 as of silicon nitride, which covers the patterned conductive layers 23 and extends into the grooves 22, is formed by, for instance, a known plasma CVD method, and a protective film 32 of a synthetic resin is formed on the passivation film 31.

In such a manner as described above, a semiconductor photoelectric conversion device 42 is fabricated in which a plurality of semiconductor photoelectric transducers 41, each comprising the patterned conductive layer 5, the patterned non-single-crystal semiconductor layer 13 and the patterned conductive layer 23, are connected in series through the portions of the conductive layers 23 extending into the grooves 12.

With the manufacturing method of the present invention described above, the patterned conductive layer 5, the patterned non-single-crystal semiconductor layer 13, and the patterned conductive layer 23, which make up each semiconductor photoelectric transducer 41, can be easily formed with high accuracy and fine resolution, without damaging them or exfoliating their marginal edges and without cracking the substrate 1.

Further, the respective layers of each semiconductor photoelectric transducer 41 are isolated from the layers of the adjoining transducer 41 by a groove of a width substantially equal to the diameter or width of the laser beam, which is as small as 3 to 60 μm, so that a semiconductor photoelectric conversion device 42 can easily be manufactured in which a plurality of semiconductor photoelectric transducers 41 are arranged with a high density.

While in the foregoing present invention has been described as being applied to the manufacture of a semiconductor photoelectric conversion device, it will be apparent that the invention is also applicable to the manufacture of various semiconductor devices each of which has at least a patterned conductive metal layer, a patterned non-single-crystal semiconductor layer, or a laminate member comprising a transparent conductive layer and a nontransparent conductive layer.

Further, although the foregoing description has been given of the case of cutting a layer member to be patterned by a linear laser beam or beams into a plurality of patterned layers which are each separated from adjacent ones by a groove of substantially the same width as that of the laser beam or beams, it is also possible to form a narrower patterned layer by moving the linear laser beam in a direction, for instance, perpendicular to its lengthwise direction to remove the layer member to be patterned over a width larger than that of the linear laser beam.

It will be apparent that many modifications and variations may be effected without departing from the scope of the novel concepts of the present invention.

What is claimed is:

1. A method for the manufacture of an electronic device which is provided with at least a patterned conductive metal layer, comprising the steps of:
   forming a conductive metal layer member; and
   exposing the conductive metal layer member to irradiation by one or more linear pulsed laser beams having a wavelength of 400 nm or less and a duration of 50 nano-seconds or less and having optical energy greater than the optical band gap energy of the conductive metal layer member, thereby forming the patterned conductive metal layer.

2. The manufacturing method according to claim 1 wherein the conductive metal layer member consists principally of a sublimable metal chosen from Cr, Cr-Cu alloy, Cr-Ag alloy or Cr-N alloy, or a nonsublimable metal chosen from Al, Cu, Ag, Ni, Mg or stainless steel.

3. The manufacturing method according to claim 2 wherein the conductive metal layer member has a thickness of 2 $\mu$m or less.

4. The manufacturing method according to claim 1 wherein the conductive metal layer member is formed on a substrate having a surface comprising an organic or inorganic insulator, or a non-single-crystal semiconductor layer.

5. A method for the manufacture of an electronic device which is provided with at least a patterned laminate member comprising a transparent conductive layer and a nontransparent or reflective conductive layer, comprising the steps of:
   forming a laminate member comprising a transparent conductive layer and a nontransparent or reflective conductive layer; and
   exposing the laminate member to irradiation by one or more linear pulsed laser beams having a wavelength of 400 nm or less and a duration of 50 nano-seconds or less and having optical energy greater than the optical band gap energy of the laminate member, thereby forming the patterned laminate member.

6. The manufacturing method according to claim 5 wherein the transparent conductive layer of the laminate member consists principally of a sublimable metallic oxide chosen from $SnO_2$, $In_2O_3$, or ITO (Indium-Tin Oxide), or a sublimable nonoxide chosen from Si-Cr or Si-Ni alloy, or a sublimable metallic nitride such as SbN, InN or $Sn_5N_4$.

7. The manufacturing method according to claim 5 wherein the laminate member has a thickness of 2 $\mu$m or less.

8. The manufacturing method according to claim 5 wherein the laminate-member is formed on a substrate having a surface comprising an organic or inorganic insulator, or a non-single-crystal semiconductor layer.

9. A method for the manufacture of an electronic device which is provided with at least a patterned non-single-crystal semiconductor layer, comprising the steps of:
   forming a non-single-crystal semiconductor layer member; and
   exposing the non-single-crystal semiconductor layer member to irradiation by one or more linear pulsed laser beams having a wavelength of 400 nm or less and a duration of 50 nano-seconds or less and having optical energy greater than the optical band gap energy of the non-single-crystal semiconductor layer member, thereby forming the patterned non-single-crystal semiconductor layer.

10. The manufacturing method according to claim 9 wherein the non-single-crystal semiconductor layer member consists principally of a sublimable semiconductor which includes hydrogen or a halogen as a dangling bond neutralizer, chosen from Si, $Si_xGe_{1-x}$ (where $0<x<0.5$), $Si_xC_{1-x}$ (wherein $0<x<1$), $Si_3N_{4-x}$ (wherein $0<x<2$), or $SiO_{2-x}$ (where $0<x<1$).

11. The manufacturing method according to claim 10 wherein the non-single-crystal semiconductor layer member has a thickness of 2 $\mu$m or less.

12. The manufacturing method according to claim 9 wherein the non-single-crystal semiconductor layer member is formed on a substrate or a conductive metal layer.

13. The manufacturing method according to claim 1, 5 or 9 wherein the laser beam or beams are excimer laser beams having a wavelength of about 193 nm (ArF), about 248 nm (KrF), about 308 nm (XeCl), or about 315 nm (XeF), argon laser beams having a wavelength of about 363 or about 351 nm, or nitrogen laser beams having a wavelength of 337 nm.

14. The manufacturing method according to claim 1, 5 or 9 wherein the exposure to the laser beam irradiation is effected in a low-pressure atmosphere.

15. The manufacturing method according to claim 1, 5 or 9 wherein the exposure to the laser beam irradiation is effected in a low-pressure atmosphere having a degree of vacuum of $10^{-5}$ torr or less.

16. The manufacturing method according to claim 1, 5 or 9 wherein the laser beam or beams are obtained by diverging a laser beam from a laser beam source and then applying the diverged beam to a cylindrical lens or lenses to converge it.

17. The manufacturing method according to claim 16 wherein the laser beam source is an excimer laser beam source, argon laser beam source, or nitrogen laser beam source.

18. The manufacturing method according to claim 16 wherein the laser beam or beams are about 15 $\mu$m wide in cross section on the layer member to be patterned.

* * * * *